United States Patent
Sanada et al.

[11] Patent Number: 6,064,181
[45] Date of Patent: May 16, 2000

[54] METHOD FOR DETECTING FULLY-CHARGED STATE OF RECHARGEABLE BATTERY

[75] Inventors: Yoshihiro Sanada; Hiroshi Eto, both of Tokyo, Japan

[73] Assignee: Oki Electric Industry Co., Ltd., Tokyo, Japan

[21] Appl. No.: 09/035,840

[22] Filed: Mar. 6, 1998

[30] Foreign Application Priority Data

Mar. 10, 1997 [JP] Japan ................................. 9-054459

[51] Int. Cl.$^7$ ........................................... H02J 7/00
[52] U.S. Cl. ................................. 320/132; 320/130
[58] Field of Search ........................... 320/132, 130, 320/139, 152

[56] References Cited

U.S. PATENT DOCUMENTS

| | | | |
|---|---|---|---|
| 4,554,500 | 11/1985 | Sokira | 320/139 |
| 5,465,039 | 11/1995 | Narita et al. | 137/551 |
| 5,666,039 | 9/1997 | Odaohara et al. | 320/152 |
| 5,892,354 | 4/1999 | Nagao et al. | 363/95 |

Primary Examiner—Edward H. Tso
Assistant Examiner—Lawrence Luk
Attorney, Agent, or Firm—Rabin & Champagne, P.C.

[57] ABSTRACT

The difference voltage between the terminal voltage VB of a rechargeable battery BAT and a reference voltage Vz1 is amplified at an initial gain, thereby reducing an amplified voltage value S12. This amplified voltage value S12 is A/D converted into digital value S13. Further, an electrical signal S18 is detected corresponding to the ambient temperature around the battery and is then A/D converted into a digital value S19. Digital values S13 and S19 charge with the progress of charging of the rechargeable battery. The change in these digital values is read by CPU 14 one after another, and the gain used in amplification of the difference voltage is renewed by the gains corresponding to digital values S13 and S19, which are stored in advance in a ROM 20. In the same manner, the reference voltage used in amplification of the difference voltage is renewed by reference voltages Vz2, Vz3, and Vz4 one by one with the progress of charging of the rechargeable battery. When the digital value S13 is decreased, CPU 14 judges that charging of the rechargeable battery is completed, thus a voltage drop −ΔV being caused in the terminal voltage VB, and controls a constant current circuit portion 17 to terminate the supply of the charging current S17.

14 Claims, 3 Drawing Sheets

CHARACTERISTIC CURVES OF
CHARGING VOLTAGE

SETTING OF REFERENCE VOLTAGE & GAIN

METHOD FOR DETECTING FULLY-CHARGED STATE OF RECHARGEABLE BATTERY

BACKGROUND OF THE INVENTION

This invention relates to a method for detecting the fully-charged state of a rechargeable battery (merely referred to as "battery" hereinafter just for simplification) such as a Ni-Cd battery, a Ni-MH battery or the like, when charging it by means of a battery charger.

When charging a battery such as a Ni-Cd battery, a Ni-MH battery or the like, by means of a battery charger, it is typically observed that the terminal voltage VB of the battery drops when the battery is fully charged. Thus, by using this characteristic, the fully-charged state of a battery has been detected by measuring the voltage drop (referred to as $-\Delta V$ hereinafter) in the terminal voltage VB of the battery during the charging process.

FIG. 2 is a block diagram showing an example of the typical arrangement of a conventional battery charger which makes use of the above-mentioned battery characteristic.

In such a battery charger as shown in FIG. 2, the terminal voltage VB of the battery BAT is attenuated by an attenuator (ATT) 1 and is inputted to an analog/digital converter 2 (referred to as ADC hereinafter). The output signal S2 from ADC 2 is inputted to and is read by a central processing unit 3 (referred to as CPU hereinafter). When the terminal voltage VB drops and the output signal S2 is reduced, it is judged based on a program stored in advance in a Read Only Memory 4 (referred to as ROM hereinafter) that charging of the battery BAT has been completed, and the supply of output current S5 from a constant current circuit 5 to the battery BAT is terminated.

In such a conventional battery charger as described in the above, in order to detect the amount of voltage drop $-\Delta V$ in the terminal voltage VB, the amount $-\Delta V$ has undergone an analog/digital conversion (referred to as A/D conversion hereinafter) by means of the ADC 2, of which the quantization bit number is 8 or 10 bits, for instance. In case a small charging current is used for charging the battery, however, the change in the voltage drop amount $-\Delta V$ becomes so small that a more accurate ADC, for instance one having a quantization bit number more than 10 bits, is required for detection. This should necessarily lead to a high cost for battery charger.

It is generally known that the peak value of, and the amount of the voltage drop $-\Delta V$ in the terminal voltage VB change depending not only on the kind of battery but also on the ambient temperature of the battery. Despite the existence of such knowledge, the detection of the quantity $-\Delta V$ has been executed thus far without paying any attention to changes caused by surrounding conditions. Especially, when the ambient temperature is high, the voltage drop quantity $-\Delta V$ becomes so small that it is erroneously detected, whereby accurate detection of a folly-charged state of a battery has been impossible. In the case of a lithium ion battery, voltage drop in the terminal voltage VB does not occur even when the fully-charged state of the battery is established, so that it is not possible to detect the fully-charged state of such battery.

Further, in order to improve the accuracy of detection of the fully-charged state of a battery, it might be tried in some cases to amplify the terminal voltage VB. However, if the terminal voltage VB is simply amplified, and the amplified terminal voltage exceeds the allowable input voltage of the ADC 2, it would become impossible to secure a dynamic range.

SUMMARY OF THE INVENTION

Accordingly, the invention has been made in view of the above-mentioned problems that have been encountered with the conventional battery charger, and an object of the invention is to provide a novel and improved battery charger that will not be required to be provided with such an ADC as has a higher quantization bit number, even when the battery is charged with a low charging current.

Another object of the invention is to provide a novel and improved battery charger which can accurately detect the terminal voltage of the battery regardless of the battery type and changes in the ambient temperature, so that the frequency of erroneous detection of a fully-charged state of a battery is much reduced or is eliminated.

In order to solve the above-mentioned problems, according to first aspect of the invention, there is provide a method for detecting battery having a reduced terminal voltage starts with supplying a charging current thereto. The difference between the terminal voltage of the discharged battery and a preset reference voltage, is amplified by a preset gain, thereby producing an amplified voltage value. This amplified voltage value is A/D converted into a digital value, which changes with the progress of charging the battery. The changing digital value is read out repeatedly by a central processing unit (CPU). The gain used in the above-mentioned amplification processing is replaced by a gain which is defined in advance so as to correspond to the changing digital value. When the digital value falls to a value lower than a predetermined one, it is judged by the CPU that the battery charge is complete, and the supply of the charging current to the battery accordingly is terminated. In the above amplification processing, the gain may be weighted depending on the ambient temperature and the battery type.

According to this first aspect of the invention, the method for detecting the fully-charged state of the battery is constituted as described in the above. That is, in the amplification processing, the difference between the terminal voltage of the battery and the preset reference voltage, is amplified at a preset gain, thereby producing an amplified difference voltage value, which in turn is A/D converted to a digital value. In the gain renewal (adjustment) processing, each consecutive digital value is read out one after another, and the reference voltage, is amplified at a preset gain, thereby producing an amplified difference voltage value, which in turn is A/D converted to a digital value. In the gain renewal (adjustment) processing, each consecutive digital value is read out one after another, and the gain used in the amplification processing is changed to a gain predefined in correspondence to the digital value. In the processing for detecting the fully-charged state of the battery, when the digital value is reduced, it is judged that the voltage drop $-\Delta V$ has resulted from completion of the battery charge, and the supply of charging current to the battery accordingly is terminated. In a method for detecting the fully-charged state of a battery according to a second aspect of the invention, charging a discharged battery with lowered terminal voltage is initiated by supplying a charging current thereto. The difference between the terminal voltage of the discharged battery and a preset reference voltage is amplified at a presetting gain, thereby producing an amplified voltage difference value. This amplified difference voltage value is A/D converted to a digital value, which changes with the progress of the battery charge. The changing digital values are consecutively read out one after another by the CPU. The reference voltage used in the above amplification processing is changed to reference voltage values which are defined in advance so as to correspond to the changing digital values. When the digital value falls to a value lower than a predetermined one, it is judged by a CPU that the battery charge is complete and the supply of charging current to the battery is terminated. In the above amplification processing, the reference voltage may be weighted depending on the ambient temperature and the battery type.

This second aspect of the invention is different form the first aspect in the point that the reference voltage used in the amplification processing is renewed (adjusted) in the reference voltage renewal processing.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

Now, a method for detecting the fully-charged state of a battery according to the invention will be described in detail in the following, by way of a preferred embodiment of the invention with reference to the accompanying drawings.

Figure 1:
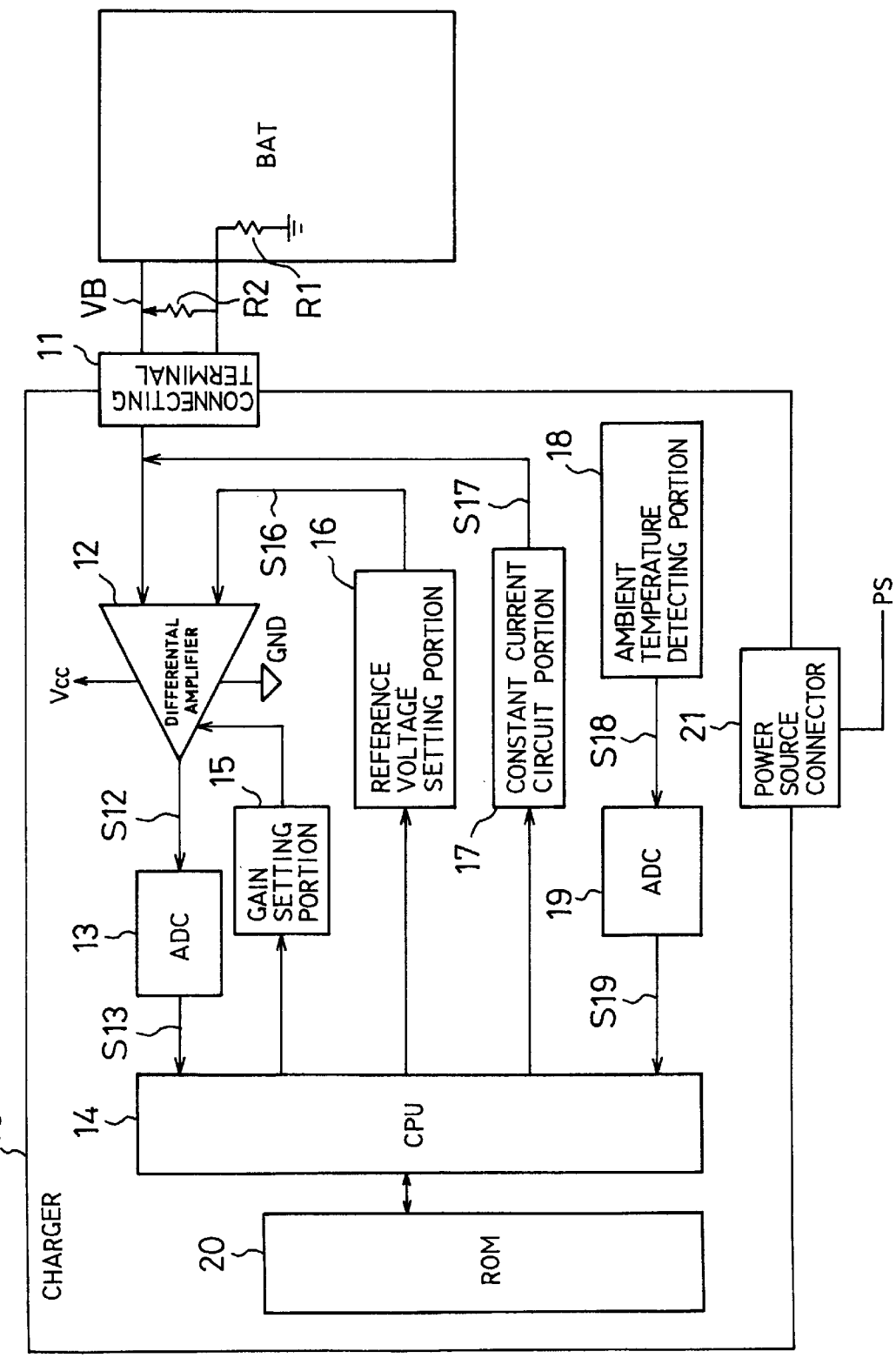
FIG. 1 is a block diagram showing the arrangement of a battery charger embodied according to the invention.
Figure 2:
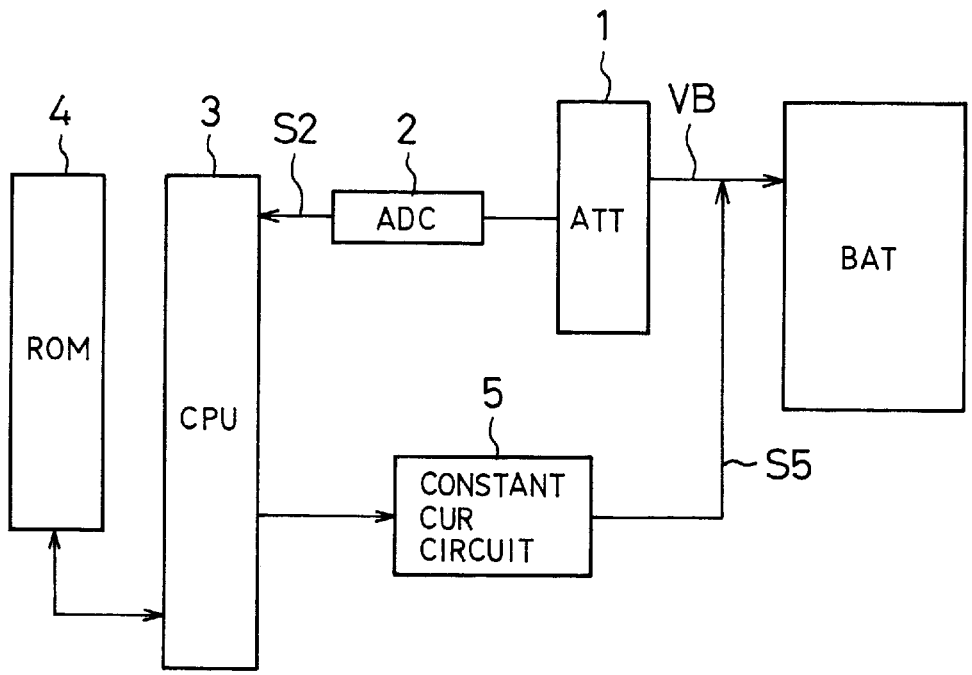
FIG. 2 is a block diagram showing the arrangement of a conventional battery charger.

FIG. 1 is a block diagram showing the arrangement of a battery charger for executing a method for detecting the fully-charged state of a battery, according to the invention.

This battery charger 10 has a connecting terminal 11 for connecting a rechargeable battery BAT thereto. The connecting terminal 11 is connected with a first input terminal of a differential amplifier 12. The plus (+) side power source potential input terminal of the differential amplifier 12 is connected with the power source voltage Vcc while the minus (−) side power source potential input terminal of the same is grounded (GND). This differential amplifier 12 has the function of amplifying the difference between the voltages at the first input terminal and the second input terminal, by using a predetermined preset gain. The output terminal of the differential amplifier 12 is connected with the input terminal of ADC 13. This ADC 13 has such a resolution power that the quantization bit number is 8 or 10 bits, and has the function of converting the output signal S12 (i.e. amplified voltage value) from the differential amplifier 12 and of generating a first digital value S13. The output terminal of ADC 13 is connected with CPU 14. CPU 14 is connected with the gain setting terminal of the differential amplifier 12 through a gain setting portion 15 which includes among other elements, variable resistances. CPU 14 is further connected with the second input terminal of the differential amplifier 12 through a reference voltage setting portion 16. This reference voltage setting portion 16 has the function of outputting the reference voltage S16 in response to a command by CPU 14. CPU 14 is further connected with the connecting terminal 11 through a constant current circuit portion 17 which supplies the charging current to the battery BAT to be charged.

In this battery charger 10, there is further provided an ambient temperature detecting portion 18 which is formed of, among other things, a temperature sensor, for example. This ambient temperature detecting portion 18 has the function of detecting the ambient temperature of the battery BAT and of outputting an electrical signal S18 corresponding to the detected temperature. The output terminal of the ambient temperature detecting portion 18 is connected with the input terminal of ADC 19. ADC 19 has the function of performing A/D conversion of the electrical signal S18 and of generating the second digital value S19. The output terminal of ADC 19 is connected with CPU 14.

CPU 14 is also connected with a ROM 20, in which there is stored a program which, based on the digital values S13 and S19, sets the gain and reference voltage S16 of the differential amplifier 12, and controls the output current S17 from the constant current circuit portion 17. A power source connector 21 is connected with an external power source PS for supplying power of this battery charger 10.

Further, the battery to be charged includes a built-in resistance R1, of which the value is differently determined based on the battery type. Therefore, if this resistance R1 is shared by a proper resistance R2, CPU 14 can determine the type of the battery to be charged by checking the voltage at the terminal 11, and can set the gain and reference voltage S16 of the differential amplifier 12 accordingly.

Figure 3:
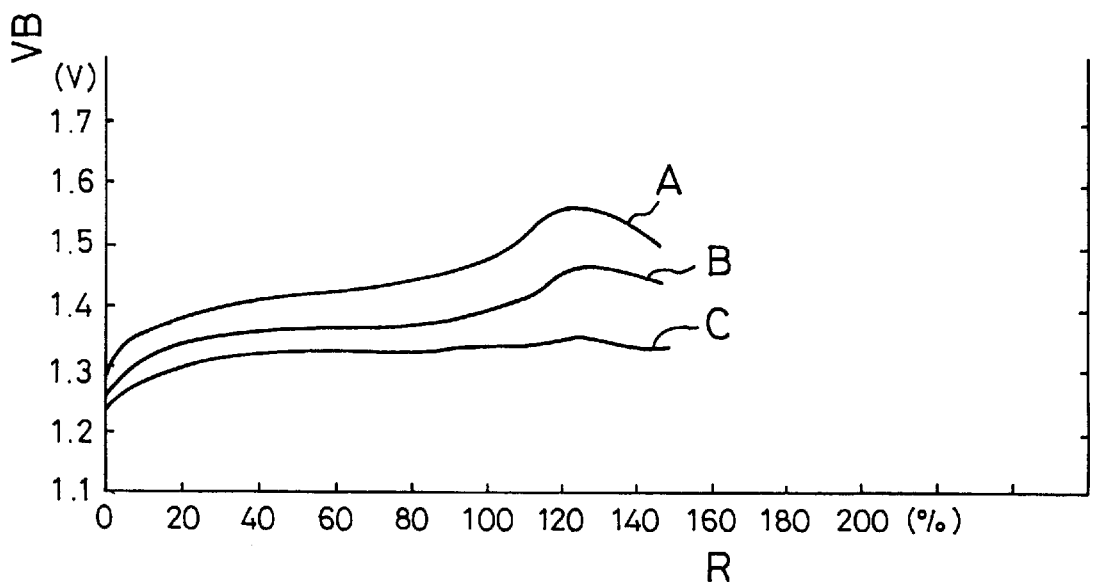
FIG. 3 is a graph showing characteristic curves of charging voltage.

FIG. 3 is a graph showing the characteristic curves with respect to the charging voltage of the battery BAT, which are plotted using ambient temperature as a parameter. The ordinate axis of the graph represents the terminal voltage VB of the battery BAT while the abscissa axis represents the charging rate R. This figure indicates that the increasing rate and voltage drop −ΔV (i.e. the voltage drop in the terminal voltage VB that occurs when the fully-charged state of the battery is achieved) change depending on the ambient temperature. For instance, the characteristic curve A indicates the relation between the terminal voltage VB and the charging rate R when the ambient temperature is 0° C. This curve indicates that the voltage drop −ΔV starts appearing when the charging rate R exceeds around 120%. Similarly, characteristic curves B and C indicate the similar relations between the terminal voltage VB and the charging rate R when the ambient temperature is 20° C. and 40° C. respectively. From these curves, it is observed that the voltage drop −ΔV becomes smaller as the ambient temperature goes up.

Figure 4:
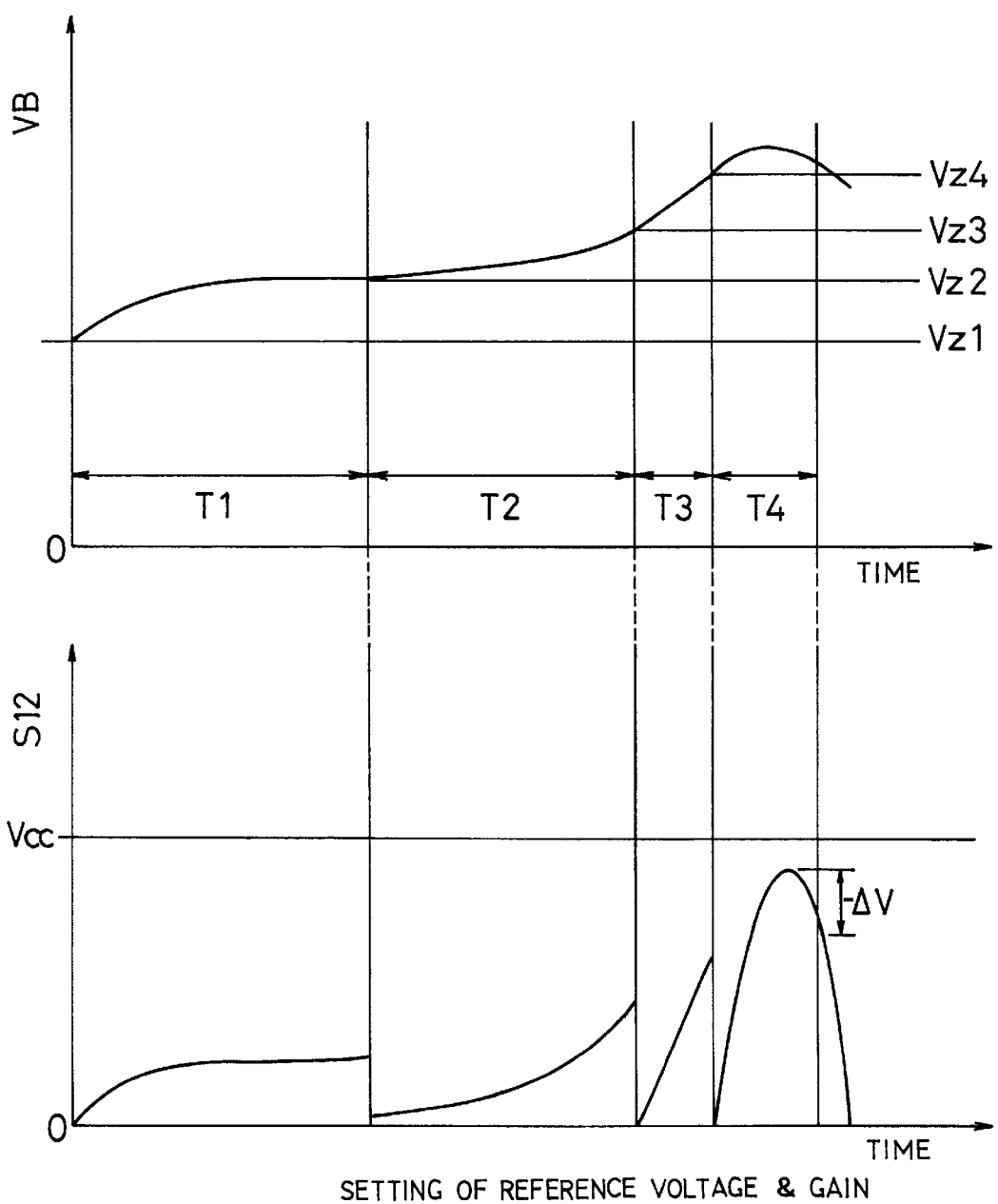
FIG. 4 shows graphs for explaining a method for setting a reference voltage and a gain.

FIG. 4 includes two graphs for explaining how to set the gain and the reference voltage. The ordinate axes of the two graphs respectively correspond to the terminal voltage VB and amplified voltage value S12, while time is measured along the abscissa axes of both graphs.

Next, the operations designated (a) through (h), shown in FIG. 1, will be described with reference to the two graphs of FIG. 4.

(a) Discrimination of Battery Type

First of all, a battery BAT having a terminal voltage VB which has dropped due to discharge, is connected with the connecting terminal 11. Then, CPU 14 determines the type of the battery BAT connected with the terminal 11, referring to the resistance R1 built in the battery. CPU 14 further sets the gain of the differential amplifier 12 and the reference voltage S16 according to the determined type of the battery. For instance, the reference voltage S16 of the reference voltage setting portion 16 is set to a minimum reference value Vz1 while the gain of the differential amplifier 12 is set to one times the difference between the terminal voltage VB and the reference voltage Vz1, i.e. the gain of 1. Completing this setting procedure, CPU 14 controls the constant current circuit portion 17 to initiate supply of a predetermined suitable charging current to the battery BAT for charging the same.

(b) Amplification Processing

In the period of time T1, the difference between the terminal voltages VB of the rechargeable battery BAT and the reference voltage Vz1 is amplified by the differential amplifier 12 at a preset gain, thereby producing an amplified voltage value S12. As will be described later, these gain and/or reference voltage that are used in the amplification processing may be properly renewed (adjusted), and also may be suitably weighted depending on the battery type and the ambient temperature.

(c) First A/D Conversion Processing

The above amplified voltage value S12 is A/D converted by ADC 13, thereby producing the first digital value S13, which represents the charging state of the battery.

(d) Processing for Detecting Ambient temperature

The ambient temperature detecting portion 18 detects an electrical signal S18 corresponding to the ambient temperature of the battery BAT.

(e) Second A/D Conversion processing

The electrical signal S18 is A/D converted by ADC 19, thereby producing the second digital value S19. As has been already described, the charging characteristic of the battery is delicately influenced by the ambient temperature, so that the gain and the reference voltage may be weighted in the renewal (adjustment) processing thereof, in view of the second digital value S19 reflecting the ambient temperature.

(f) Processing for Renewal (Adjustment) of Gain

As the periods of times T2, T3 and T4 go by consecutively with the progress of the battery charge, CPU 14 reads the changing first digital values S13 in succession and also reads the changing second digital values S19 one by one. Then, CPU 14 selects and executes the renewal adjustment of the gain used in the amplification processing, so as to make it twice, three times, and ten times the initial gain, referring to the ROM 20 which stores in advance gains that correspond to the first and second digital values S13 and S19. The gain and timing of renewal (adjustment) of the gain may be determined in advance by mean of a proper experiment. The terminal voltage drop $-\Delta V$ appears near the end of the period of time T4. This voltage drop $-\Delta V$ is small when the charging current is small and/or when the ambient temperature is high. However, as the voltage drop $-\Delta V$ is amplified at a gain which is ten times higher than the initial one, the detection of it can be carried out accurately.

(g) Processing for Renewal (Adjustment) of Reference Voltage

As periods of time T2, T3 and T4 consecutively lapse with the progress of the battery charge, CPU 14 reads, one after another, the changing first digital values S13, and also reads the second digital values S19 one by one. Then, CPU 14 selects and executes the renewal (adjustment) of the reference voltage used in the amplification processing to replace the initial reference voltage by the reference voltages Vz2, Vz3, and Vz4, referring to the ROM 20 which stores in advance various reference voltages corresponding to the first and second digital values S13 and S19. The terminal voltage drop $-\Delta V$ appears near the end of the period of time T4.

This voltage drop $-\Delta V$ is small when the charging current is small or when the ambient temperature is high. However, as the terminal voltage VB is renewed (adjusted) by the reference voltage Vz4 at the stage where the period of time T4 starts, the detection of the voltage drop $-\Delta V$ can be accurately carried out. Further, if the renewals (adjustments) of the reference voltage and the gain are carried out in parallel, more accurate detection of $-\Delta V$ may be achieved by the synergic effects of the parallel renewals.

(h) Processing for Detecting Fully-Charged State of Battery

When the digital value S13 drops, CPU 14 judges that completion of charging of the battery BAT has caused the voltage drop $-\Delta V$ in the terminal voltage VB, and controls the constant current circuit portion 17 to terminate supply of the charging current to the battery. CPU 14 may also stop the operation of the constant current circuit portion 17 when an unusual digital value S13 is produced.

As described above, the present embodiment of the invention has the following advantageous features (1) and (2).

(1) The amount of change in the terminal voltage VB is amplified by the differential amplifier 12, of which the gain and the reference voltage S16 may be renewed (adjusted) corresponding to the battery type and digital values S13 and S19, so that the terminal voltage drop $-\Delta V$ can be precisely detected without using precision ADC having a quantization bit number more than 10 bits, whereby the price of the battery charger can be lowered. Erroneous detection of the fully-charged state of the battery can be lessened or eliminated.

(2) As shown by the characteristic curve C in FIG. 3, when charging of the battery is performed at a high ambient temperature, the terminal voltage drop $-\Delta V$, is unclear, which has caused difficulty in conventional detection of the fully-charged state of the battery. However, as the gain of the differential amplifier 12 is increased in such conditions, according to the invention, it becomes possible to accurately detect the fully-charged state of the battery.

As has been discussed in the above, a method for detecting the fully-charged state of a battery according to the invention has been explained by way of a preferred embodiment of the invention with reference to the accompanying drawings. However, it should be noted that the invention is not limited to the embodiment as discusses in the above. It is apparent that any one skilled in the art may make various changes or modifications within the technical concept of the invention as recited in the claims for patent attached hereto. Accordingly, it should be understood that such changes and modifications fall within the technical scope of the invention.

For instance, the invention is applicable to any battery having such a charging characteristic that the terminal voltage drop $-\Delta V$ appears at the time when the fully-charged stage of the battery is established.

So far, the description of the invention has been directed to the case where the gain and the reference voltage are adjusted in response to the digital values S13 and S19. However, it should be understood that if the adjustment of the gain and/or the reference voltage are performed in response to the digital value 13 only, a similar function and effect may be obtained in the manner described in connection with the embodiment as mentioned in the above.

As has been discussed in detail above, the amount of change in the terminal voltage of the battery is amplified by renewing the gain the reference voltage in the amplification processing in response to the first digital value, so that the terminal voltage drop $-\Delta V$ can be precisely detected without using a precision ADC having the quantization bit number more than 10 bits, as has been used unitl now, whereby the price of the battery charger can be lowered. Further, erroneous detection of the fully-charged state of the battery can be reduced or eliminated.

When the battery is charged in a conventional manner while the ambient temperature is high, the terminal voltage drop −ΔV is unclear, which has caused difficulty in detection of the fully-charged state of the battery. However, according to an embodiment of the invention the amount of change in the terminal voltage of the battery is amplified by adjusting the gain and reference voltage in the amplification processing in response to the first and second digital values, so that the gain in the amplification processing when the ambient temperature is high, is increased and it becomes possible to accurately detect the fully-charged state of the battery.

The entire disclosure of Japanese Patent Application No. 9-54459 filed on Mar. 18, 1997 including specification, claims, drawings and summary is incorporated herein by reference in its entirety.

What is claimed is:

1. A method for detecting the fully-charged state of a rechargeable battery, comprising the steps of:
    initiating charging of a rechargeable battery by supplying a predetermined charging current thereto;
    amplifying the difference between the terminal voltage of the battery and a preset reference voltage, according to a preset gain, so as to produce an amplified voltage difference value;
    defining, in advance of said step of initiating charging, a gain value in relation to amplified voltage values;
    adjusting the gain in said step of amplifying, according to the produced amplified voltage difference value, to be equal to the gain value as defined in relation to amplified voltage values in said step of defining; and
    judging that the battery is fully charged when the amplified voltage difference value decreases.

2. A method as claimed in claim 1, further comprising the steps of:
    A/D converting the amplified voltage difference value as obtained in said amplifying step, thereby to generate a digital value; and
    determining, in said adjusting step, a gain to be used in said amplifying step in response to the digital value.

3. A method as claimed in claim 1, further comprising the step of when, by said step of judging the battery is judged to be fully charged, terminating the supply of charging current battery.

4. A method as claimed in claim 1, further comprising the steps of:
    reading a resistance value corresponding to the battery type; and
    weighting the gain according to the read resistance value.

5. A method as claimed in claim 1, further comprising the steps of:
    detecting an ambient temperature around the battery; and
    weighting the gain according to the detected ambient temperature.

6. A method as claimed in claim 5, further comprising the step of A/D converting the detected ambient temperature to produce a digital value, and said step of weighting includes weighting the gain according to the produced digital value.

7. A method as claimed in claim 1, further comprising the steps of:
    adjusting the reference voltage in parallel with the gain.

8. A method for detecting the fully-charged state of a rechargeable battery, comprising the steps of:
    initiating charging of a rechargeable battery by supplying a predetermined charging current thereto;
    amplifying the difference between the terminal voltage of the battery and a preset reference voltage, according to a preset gain, so as to produce an amplified voltage difference value;
    defining, in advance of said step of initiating charging, a reference voltage value in relation to amplified voltage values;
    adjusting the reference voltage in said step of amplifying, according to the produced amplified voltage difference value, to be equal to the reference voltage value as defined in relation to amplified voltage values in said step of defining; and
    judging that the battery is fully charged when the amplified voltage difference value decreases.

9. A method as claimed in claim 8, further comprising the steps of:
    A/D converting the amplified voltage difference value obtained in said amplifying step, thereby to generate digital value; and
    determining, in said adjusting step, a reference voltage to be used in said amplifying step in response to the digital value.

10. A method as claimed in claim 8, further comprising the step of when, by said step of judging, the battery is judged to be fully-charged, terminating the supply of charging current to the battery.

11. A method as claimed in claim 8, further comprising the steps of:
    reading a resistance value corresponding to the battery type; and weighting the gain according to the read resistance value.

12. A method as claimed in claim 8, further comprising the steps of:
    detecting an ambient temperature around the battery; and
    weighting the gain according to the detected ambient temperature.

13. A method as claimed in claim 5, further comprising the step of A/D converting the detected ambient temperature to produce a digital value, and said step of weighting includes weighting the gain according to the produced digital value.

14. A method as claimed in claim 1, further comprising the steps of:
    adjusting the gain in parallel with the reference voltage.

* * * * *